United States Patent [19]

Kuwagata et al.

[11] Patent Number: 5,442,587
[45] Date of Patent: Aug. 15, 1995

[54] SEMICONDUCTOR MEMORY DEVICE

[75] Inventors: Masaaki Kuwagata, Kawaguchi; Yuji Watanabe, Kawasaki, both of Japan

[73] Assignee: Kabushiki Kaisha Toshiba, Kawasaki, Japan

[21] Appl. No.: 68,669

[22] Filed: May 28, 1993

[30] Foreign Application Priority Data

May 29, 1992 [JP] Japan .................................. 4-138814

[51] Int. Cl.[6] .......................... G11C 29/00; G11C 7/00
[52] U.S. Cl. ................................ 365/200; 365/189.07; 365/204; 365/230.08
[58] Field of Search ................. 365/200, 189.07, 204, 365/233, 225.7, 230.08

[56] References Cited

U.S. PATENT DOCUMENTS

| | | | |
|---|---|---|---|
| 5,113,371 | 5/1992 | Hamada | 365/201 X |
| 5,265,055 | 11/1993 | Horiguchi et al. | 365/200 |
| 5,276,360 | 1/1994 | Fujima | 365/200 X |
| 5,297,088 | 3/1994 | Yamaguchi | 365/200 |

Primary Examiner—Do Hyun Yoo
Attorney, Agent, or Firm—Foley & Lardner

[57] ABSTRACT

In the memory cell provided with spare cells and normal cells, the time required to discriminate the spare column address from the normal column address or vice versa can be reduced, and thereby a high speed memory access can be realized. When an address is given from the counter to a memory circuit having the spare address and the normal address, before the counter outputs an address to the memory circuit, the spare/normal discriminating circuit acquires previously the address outputted from the counter and discriminates whether the address is the spare address or the normal address. On the basis of this discrimination, the select circuits switch the address to be applied from the select circuits to the memory circuit from the normal address to the spare address or vice versa.

24 Claims, 14 Drawing Sheets

| No | No. OF SP/NOR DISCR CKTS | No OF SP COL | RELIEF RATIO ||| No OF FUSES |
|---|---|---|---|---|---|---|
| | | | DEFF POS :1 | DEFF POS :2 | DEFF POS :3 | |
| 1 | 1 PER 2 ARRAYS | 4 | 1 | $\frac{1}{200}$ | $\frac{1}{64K}$ | 64 |
| 2 | 1 PER 1 ARRAY | 4 | 1 | $\frac{1}{2}$ | $\frac{1}{341}$ | 160 |
| 3 | 1 PER 2 ARRAYS | 8 | 1 | $\frac{1}{128}$ | $\frac{1}{16K}$ | 56 |
| 4 | 2 PER 2 ARRAYS | 8 | 1 | 1 | $\frac{1}{86}$ | 112 |
| 5 (CONV) | 1 PER 2 ARRAYS | 8 | 1 | $\frac{1}{256}$ | $\frac{1}{64K}$ | 112 |

SEMICONDUCTOR MEMORY DEVICE

FIELD OF THE INVENTION

The present invention relates to a semiconductor memory device, and more specifically to a semiconductor memory device suitable for a high speed access, in such a structure that defective cells can be replaced with spare cells for relief of the device.

BACKGROUND OF THE INVENTION

FIG. 21 is a block diagram showing a conventional semiconductor memory device of such a structure that spare column and normal column can be discriminated in serial access cycles. In FIG. 21, a counter 1 outputs a counter output signal CO to a spare decoder 2 and a normal selector 4, respectively. The spare decoder 2 discriminates whether an address of the counter output signal CO is a spare address or not, and outputs a spare/normal discrimination signal SNJ to a spare selector 3 and the normal selector 4, respectively. On the basis of the spare/normal discrimination signal SNJ, the spare selector 3 outputs a spare column select signal SCSL. On the Other hand, on the basis of the spare/normal discrimination signal SNJ, the normal selector 4 outputs a normal column select signal NCSL. These spare column select signal SCSL and the normal column select signal NCSL are both given to memory cells to select a spare column or a normal column.

The operation of the device thus constructed will be described hereinbelow.

The counter 1 is activated on the basis of a clock signal applied from a clock signal generating circuit (not shown). Here, when the counter output signal CO is a spare address, the spare decoder 2 recognizes this spare address, and switches the spare/normal discrimination signal SNJ to a status where the spare discrimination is active. As a result, the spare selector 3 sets the spare column select signal SCSL to be active. On the other hand, the normal selector 4 sets the normal column select signal NCSL to be non-active. As a result, the memory cell (not shown) is switched from the defective column to the spare column.

On the other hand, when the counter output signal CO of the counter 1 is a normal address, the spare decoder 2 recognizes this normal address, and switches the spare/normal discrimination signal SNJ to a status where the normal discrimination is active. As a result, the spare selector 3 sets the spare column select signal SCSL to be non-active. On the other hand, the normal selector 4 sets the normal column select signal NCSL to be active. As a result, the normal column is selected in the memory cell (not shown) for use.

In the conventional semiconductor memory device as described above, three operational steps are required as follows: the counter output signal CO is outputted from the counter 1; this counter output signal CO is given to the spare decoder 2 to obtain the spare/normal discrimination signal SNJ; and on the basis of the spare/normal discrimination signal SNJ, the spare column select signal SCSL is outputted from the spare selector 3, or the normal column select signal NCSL is outputted from the normal selector 4. Consequently, it takes a long time to select the spare column or the normal column whenever the memory is accessed, thus raising a problem in that an access speed of the memory cells is relatively slow.

SUMMARY OF THE INVENTION

With these problems in mind, it is the object of the present invention to provide a semiconductor memory device which can reduce the time required to discriminate the spare address from the normal address or vice versa in the memory device provided with both spare cells and normal cells.

To achieve the above-mentioned object, in a semiconductor memory device having spare cells and normal cells according to the present invention, whenever an address is given from the counter to a memory circuit having the spare address and the normal address, before the counter outputs an address to the memory circuit, the spare/normal discriminating circuit acquires previously the address outputted from the counter and discriminates whether the address is the spare address or the normal address. On the basis of this discrimination, the select circuits switch the address to be applied from the select circuits to the memory circuit from the normal address to the spare address or vice versa.

Accordingly, the time required to discriminate the spare column address from the normal column address or vice versa can be reduced, and thereby a high speed memory access can be realized.

DETAILED DESCRIPTION OF THE PREFERRED EMBODIMENTS

Embodiments of the semiconductor memory device according to the present invention will be described hereinbelow with reference to the attached drawings.

Figure 1:
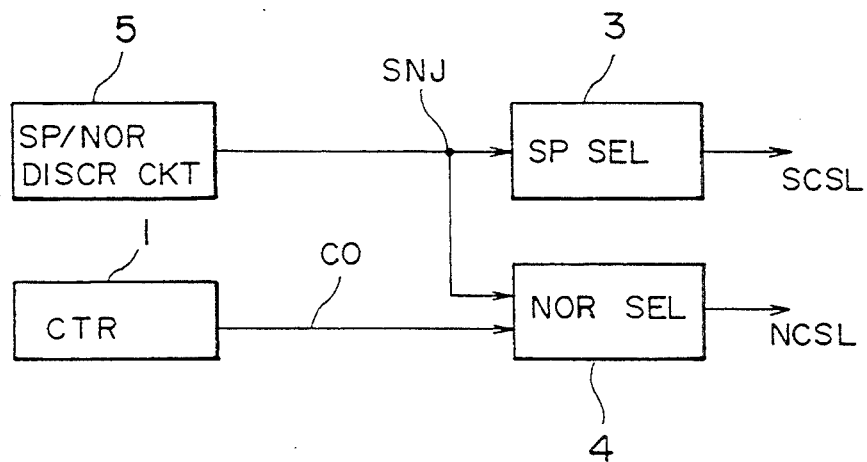
FIG. 1 is a block diagram showing a first embodiment of the semiconductor memory device according to the present invention.

FIG. 1 is a block diagram showing an embodiment of the semiconductor memory device. In FIG. 1, the memory device comprises a counter 1, a spare selector 3, a normal selector 4 and a spare/normal discriminating circuit 5. The spare/normal discriminating circuit 5 outputs a spare/normal discrimination signal SNJ in a cycle before the spare selector 3 outputs a spare column select signal SCSL or the normal selector 4 outputs a normal column select signal NCSL.

The operation of the memory device shown in FIG. 1 will be described hereinbelow.

Before a cycle during which the spare selector 3 outputs the spare column select signal SCSL or the normal selector 4 outputs the normal column select signal NCSL, the spare/normal discriminating circuit 5 decides the spare/normal discrimination signal SNJ. As a result, it is possible to reduce the time required to discriminate the spare column from the normal column or vice versa. In other words, it is possible to realize a high speed access memory on the basis of the output signal CO of the counter 1.

Figure 2:
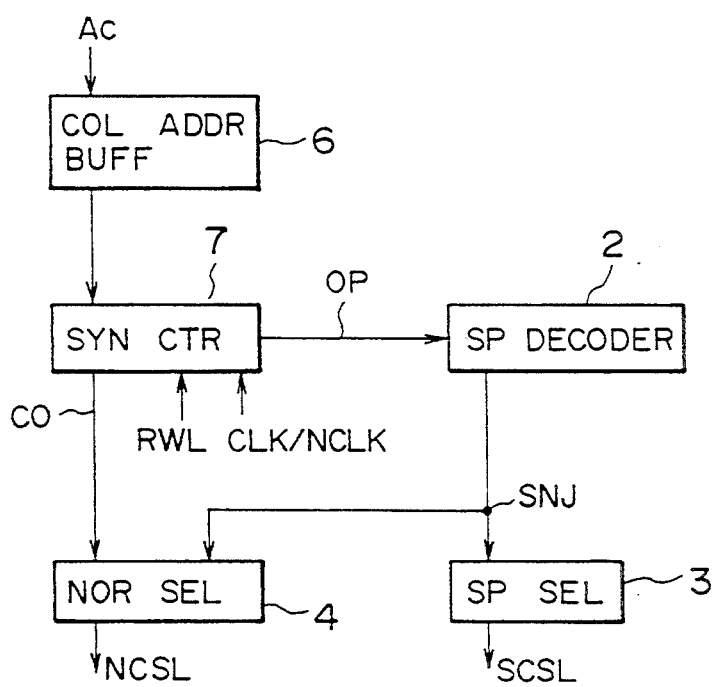
FIG. 2 is a block diagram showing a practical circuit configuration of the memory device shown in FIG. 1.

FIG. 2 is a block diagram showing a practical example of the semiconductor memory device shown in FIG. 1. The device comprises a spare decoder 2, the spare selector 3, the normal selector 4, a column address buffer 6 and a synchronizing counter 7.

The column address buffer 6 acquires a column address Ac inputted externally. The synchronizing counter 7 acquires a column address from the column address buffer 6 on the basis of a column address deciding reference signal RWL. In serial cycle, this synchronizing counter 7 outputs a column address to be selected as a counter output signal CO to the normal selector 4, and further an output preparation signal OP to the spare decoder 2, in response to a clock CLK and an inversion clock NCLK.

Figure 3:
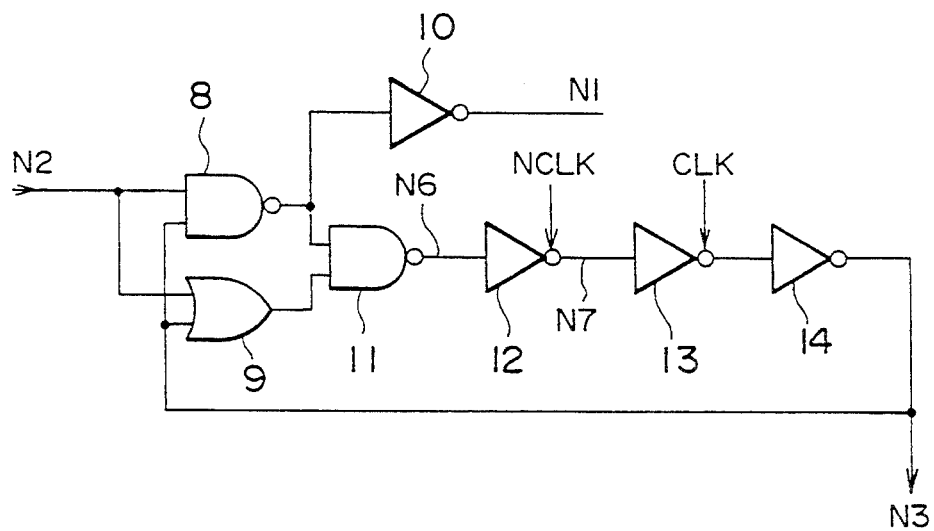
FIG. 3 is a block diagram showing the configuration of the first stage synchronizing counter of the memory device shown in FIG. 2.

FIG. 3 shows one stage counter portion of the synchronizing counter 7 shown in FIG. 2. In FIG. 3, a node N2 receives a carry signal from the preceding stage. The node N2 is connected to a NAND gate 8 and an OR gate 9, respectively. The output of the NAND gate 8 is given to an inverter circuit 10 and a NAND gate 11. The output of the OR gate 9 is given to a NAND gate 11. The output (a node N6) of the NAND gate 11 is inputted to a clocked inverter circuit 12. The output (a node N7) of the clocked inverter circuit 12 is given to a clocked inverter circuit 13. The output of the clocked inverter circuit 13 is connected to the output (a node N3) of the present stage of the counter 7 through an inverter circuit 14. The output of the inverter circuit 14 is also applied to the NAND gate 8 and the OR gate 9, respectively. Further, the output (a node N1) of the inverter circuit 10 transmits a carry signal to the succeeding stage. A clock CLK is given to the clocked inverter circuit 13, and another clock NCLK (an inversion signal of the clock CLK) is given to the clocked inverter circuit 12.

By connecting n-units of the one-stage circuits as shown in FIG. 3 in series, it is possible to configure an n-stage synchronizing counter 7 and thereby to realize a synchronous operation such that all the stages begin counting operation simultaneously in synchronism with the clock CLK. In more detail, when the one-stage counter output signal CO is outputted to the node N3 on the basis of the clock CLK, the status of a carry signal from the preceding (the value at the node N1) and the status of the present stage (the value at the node N3) are both decided. On the basis of the values at these nodes N1 and N3, the synchronizing counter 7 discriminates whether the present stage should be carried up or not in response to the succeeding clock CLK. In other words, on the basis of the exclusive logical sum of the NAND gate 8, the OR gate 9, and the NAND gate 9, the decided result thereof is transmitted to the node N6. In response to the clock NCLK, the status at the node N6 is transmitted to the node N7, so that the succeeding counter output signal CO is influenced by the present stage of the synchronizing counter 7.

Figure 4:
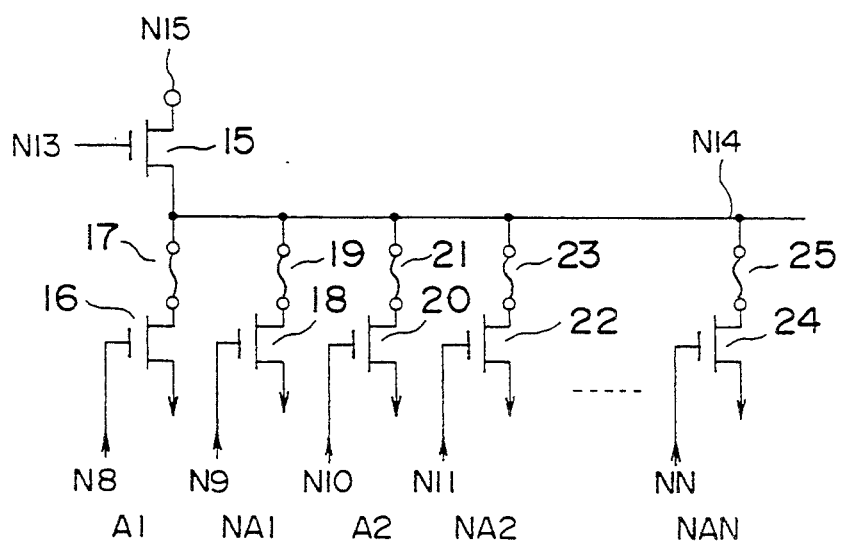
FIG. 4 is a circuit diagram showing an example of the configuration of the spare decoder of the memory device shown in FIG. 2.

The operation of the circuit shown in FIG. 3 will be described hereinbelow:

First, on the basis of the column address deciding reference signal RWL (shown in FIG. 2), a column address is set from the column address buffer 6 to the synchronizing counter 7. This operation is implemented by compulsory presetting the node N6 or N7 (shown in FIG. 3). On the other hand, the synchronizing counter 7 can be formed by arranging N-units of the one-stage circuits as shown in FIG. 3 in series. In this case, the counter output signals CO at the nodes N3 of the respective stages are given to the normal selector 4, and the output preparation signals OP at the nodes N7 of the respective stages are given to the spare decoder 2. As a result, the synchronizing counter 7 decides the counter output signal CO in response to the clock CLK. In advance, the signal the same as the counter output signal CO has been outputted as the output preparation signal OP. In other words, before the counter output signal CO is outputted by the synchronizing counter 7, an address signal quite the same as the counter output signal CO is given to the spare decoder 2 as the output preparation signal OP. Therefore, the spare decoder 2 discriminates whether the spare column or the normal column is used in response to the present address, so that it is possible to apply the spare/normal discrimination signal SNJ to the normal selector 4 or the spare selector 3 previously. In practice, therefore, at the time when an address is outputted from the synchronizing counter 7 as the counter output signal CO, it has been decided whether the normal column select signal SCSL is set to be active or the spare column select signal SCSL is set to be active. Accordingly, it is possible to reduce the access time to the memory cell (not shown), as compared with the conventional method in which the normal address or the spare address is decided in response to the counter output signal CO. In this connection, in the case where an address is shifted from the column address buffer 6 to the synchronizing counter 7, it is possible to discriminate the spare address previously by applying the output of the column address buffer 6 to the spare decoder 2 as the output preparation signal OP FIG. 4 is a circuit diagram showing an example of the circuit configuration of the spare decoder 2 shown in FIG. 2. In FIG. 4, the source of a P-type MOS transistor 15 is connected to a node N15 of a supply voltage level; the drain thereof is connected to a node N14; and the gate thereof is connected to a node N13. On the other hand, a plurality of fuses 17, 19, 21, 23, . . . , 25 are connected to a node N14. The drains of N-type MOS transistors 16, 18, 20, 22, . . . , 24 are connected to the fuses 17, 19, 21, 23, . . . , 25, respectively. The sources of these transistors 16 to 24 are grounded, and the gates thereof are connected to nodes N8 to NN, respectively. Further, the bits AN (A1, A2, . . . , AN) and the inversion bits of NAN (NA1, NA2, . . . , NAN) of an address included in the output preparation signal OP are connected to the nodes N8 to NN, respectively. Here, some of the fuses 17, 19, 21, 23, . . . , 25 which correspond to the spare address of the memory cell (not shown) are previously cut off.

The operation of the circuit as described above will be described herein below.

To the nodes N8 to NN of the spare decoder 2 shown in FIG. 4, the output preparation signal OP of the synchronizing counter 7; that is, the signals at the node N7 (shown in FIG. 3) and the inversion signals thereof A1, NA1, A2, NA2, . . . , AN, NAN are inputted. Here, some of the fuses 17, 19, 21, 23, . . . , 25 are cut off previously, which are connected to the drains of the N-type MOS transistors 16, 18, 20, 22, . . . , 24 having gates to which a spare address is inputted. Further, a precharge signal is inputted to the node N13 to supply a charge from the node N15 to the node N14. At this time, if a path connecting between the node N14 and the ground is not formed, the node N14 is precharged to the supply voltage; and if the path is formed therebetween, the node N14 is discharged. In other words, the N-type MOS transistors 16, 18, 20, 22, . . . , 24 are selectively turned on in response to the address signal applied to the nodes N8 to NN, respectively. Here, when some of the fuses 17, 19, 21, 23, . . . , 25 connected to the turned-on transistors are cut off, the node N14 is precharged to the supply voltage. On the other hand, even if one of the fuses 17, 19, 21, 23, . . . , 25 connected to the turned-on transistors is not cut off, the node N14 is discharged through the fuse not cut off and the transistor corresponding thereto. That is, when the address of the output preparation signal OP given from the synchronizing counter 7 to the spare decoder 2 corresponds to the spare address, the spare/normal discrimination signal SNJ outputted from the node N14 is set to the supply voltage. In a case other than the above, the spare/normal discrimination signal SNJ is set to the ground level. Accordingly, it is possible to decide the spare/normal discrimination signal SNJ on the basis of the fact that the address of the output preparation signal OP given to the nodes N8 to NN is the spare address or an address other than the spare address. In other words, it is also possible to discriminate previously whether the counter output signal CO of the synchronizing counter 7 is a spare address or not.

Figure 5:
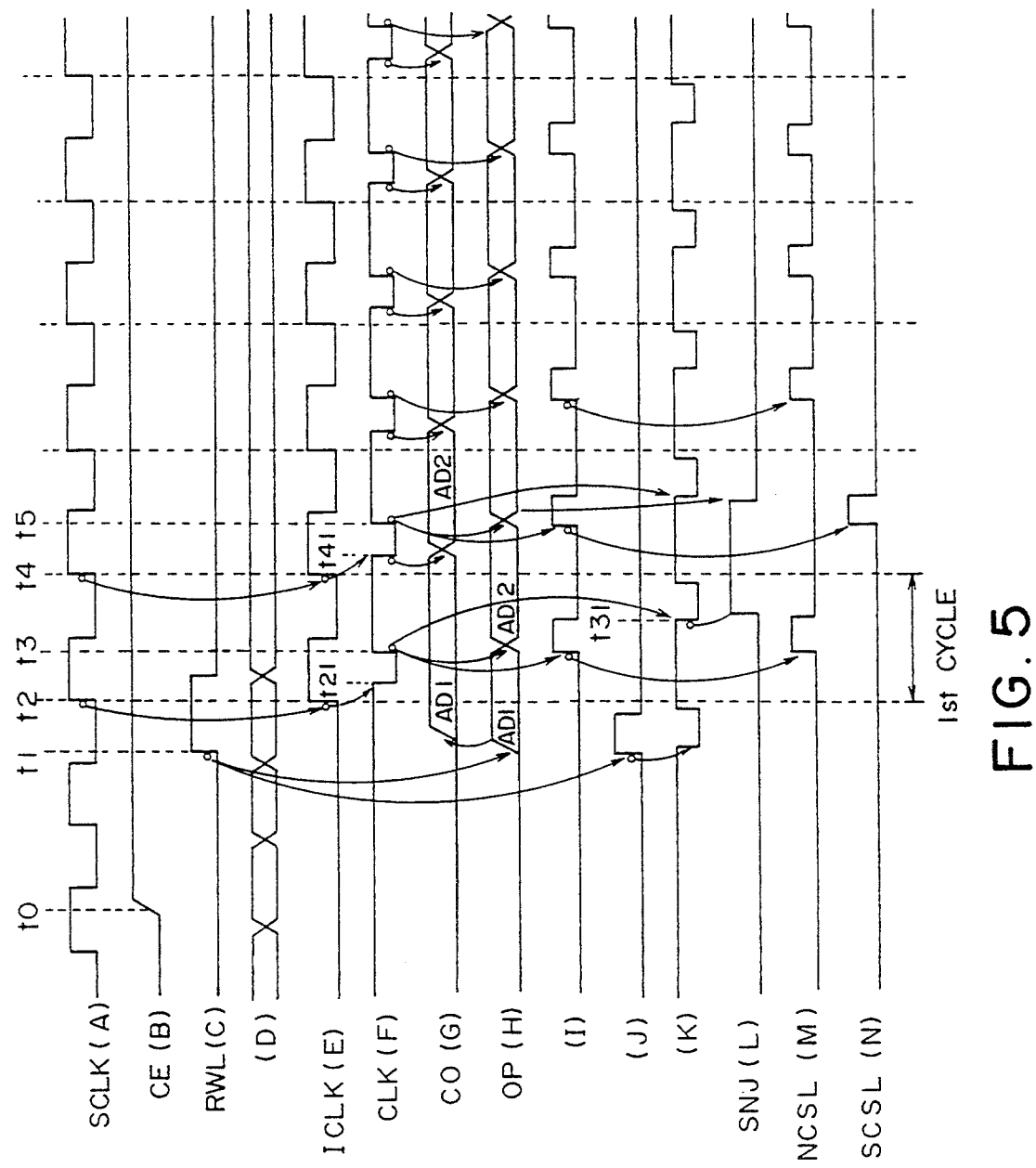
FIG. 5 is a timing chart for assistance in explaining the operation of the memory device shown in FIG. 2.

FIG. 5 is a timing chart showing the above-mentioned operation in sequence. In FIG. 5, (A) denotes a system clock SCLK given externally to determine the operation timing; (B) denotes a chip enable signal CE for selecting this memory chip; (C) denotes an column address deciding reference signal RWL used as a reference of the column address deciding timing; (D) denotes an address given to this memory cell; (E) denotes an internal clock ICLK used as a reference of the operation of the synchronizing counter 7; (F) denotes a clock CLK for driving the synchronizing counter 7 formed on the basis of the internal clock ICLK; (G) denotes a counter output signal CO outputted by the synchronizing counter 7; (H) denotes an output preparation signal OP outputted by the synchronizing counter 7 in advance of the counter output signal CO; (I) denotes a driving signal for driving the spare selector 3 and the normal selector 4; (J) denotes a pulse formed on the basis of the column address deciding reference signal RWL; (K) denotes a precharge signal given to the spare decoder 2; (L) denotes a spare/normal discrimination signal SNJ outputted by the spare decoder 2; (M) denotes a normal column select signal NCSL outputted by the normal selector 4; and (N) denotes a spare column select signal SCSL outputted by the spare selector 3.

As shown by (B) in FIG. 5, when the chip enable signal CE for selecting the memory chip is inputted at time t0, a reference of timing at which a row address is decided is given. Successively, as shown by (C), the column address deciding reference signal RWL used as a reference of the column address deciding timing is given at time t1. That is, the row address is decided when the chip enable signal CE changes from a level "L" to another level "H", and the column address is decided when the column address deciding reference signal RWL changes to the level "H". Then, when the first system clock SCLK as shown by (A) rises at time t2, the first one cycle starts. The cycle is shifted to the succeeding cycle in sequence whenever the system clock SCLK rises.

On the other hand, after the column address deciding reference signal RWL has changed to the level "H", as shown by (E), the internal clock ICLK synchronized with the system clock SCLK is generated. Further, on the basis of time t2 (at which the internal clock ICLK rises), the clock CLK for driving the synchronizing counter 7 (which falls at time t21) is formed as shown by (F). Further, at time t1 (at which the column address deciding reference signal RWL changes to the level "H"), a column address is acquired from the outside to the output preparation node of the synchronizing counter 7 in response to the pulse signal shown by (J) and generated on the basis of the column address deciding reference signal RWL. The address AD1 is transmitted to the node N3 and the node N6 both shown in FIG. 3, and outputted from the synchronizing counter 7 as the output preparation signal OP and also as counter output signal CO as shown by (G), immediately thereafter. On the other hand, on the basis of the pulse signal as shown by (J), the precharge signal as shown by (K) given to the node N13 shown in FIG. 4 is formed. Therefore, the address of the output preparation signal OP outputted by the synchronizing counter 7 is discriminated by the spare decoder 2 as to whether the address is the normal address or the spare address, so that the spare/normal discrimination signal SNJ as shown by (L) can be outputted. In this connection, the spare/normal discrimination signal SNJ is decided when the precharge signal changes to the level "L", and held in the decided status when the precharge signal changes to the level "H".

Successively, as shown by (F) in FIG. 5, the clock CLK changes from the level "L" to the level "H" at time t3. On the other hand, as shown by (I), the spare selector 3 or the normal selector 4 outputs a signal for deciding the spare/normal discrimination signal SNJ. As a result, as shown by (M) and (N), on the basis of the output preparation signal OP, the normal column select signal NCSL changes to the level "H" in the case of the normal address, and the spare column select signal SCSL changes to the level "H" in the case of the spare address. On the other hand, as shown in by (F), when the clock CLK changes from the level "L" to the level "H" at time t3, the address of the output preparation signal OP of the synchronizing counter 7; that is, the succeeding address AD2 is decided. Further, when the clock CLK changes from the level "L" to the level "H", the precharge signal given to the node N13 shown in FIG. 4 is formed at time t31 as shown by (K). Therefore, the address AD2 of the output preparation signal OP outputted by the synchronizing counter 7 is discriminated by the spare decoder 2 as to whether the address is the normal address or the spare address, so that the spare/normal discrimination signal SNJ as shown by (L) can be outputted.

Thereafter, when the system clock SCLK rises at time t4, the succeeding cycle begins. Upon rising of the internal clock ICLK, the clock CLK changes from the level "H" to the level "L" at time t41, so that the counter output signal CO of the synchronizing counter 7 becomes the succeeding address AD2. In advance of time t3, the output preparation signal OP of the synchronizing counter 7 has already outputted the succeeding address AD2. Therefore, the spare decoder 2 has already outputted the spare/normal discrimination signal SNJ as shown by (L) on the basis of the precharge signal which changes to the level "L" at time t31 as shown by (K). Accordingly, the address AD2 can be decided by the counter output signal CO of the synchronizing counter 7 at time t4. At this time, the discrimination of whether the address is the normal address or the spare address has been completed. Therefore, at time t5 when the clock CLK changes from the level "L" to the level "H", the normal column select signal NCSL or the spare column select signal SCSL is outputted as shown by (M) or (N).

Now, the precharge signal for forming the spare/normal discrimination signal SNJ as shown by (K) in FIG. 5 is formed when the clock CLK for driving the synchronizing counter 7 changes from the level "L" to the level "H" under the ordinary condition. At the first, however, the precharge signal is formed under the condition that the column address deciding reference signal RWL changes from the level "L" to the level "H". This is because the address first given from the column address buffer 6 to the synchronizing counter 6 on the basis of the column address deciding reference signal RWL must be discriminated as the normal address or the spare address. In other words, the spare/normal discrimination signal SNJ must be formed in the first cycle.

Figure 6:
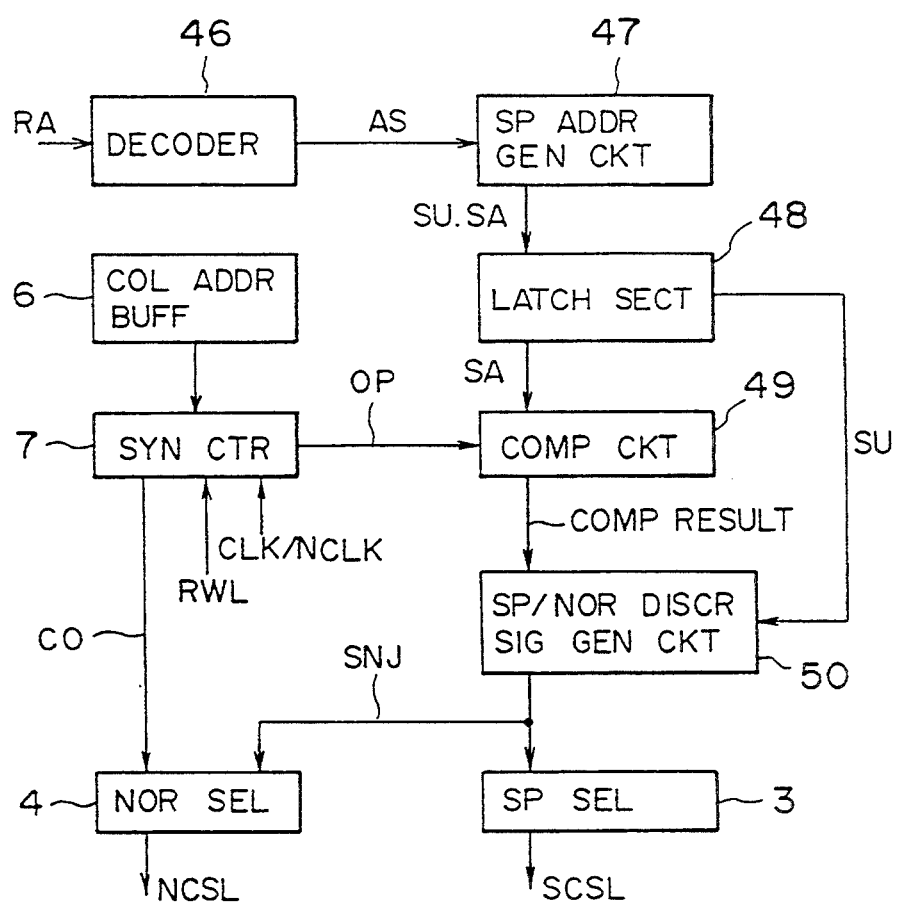
FIG. 6 is a block diagram showing another embodiment of the semiconductor memory device according to the present invention.

FIG. 6 is a block diagram showing another embodiment of the semiconductor memory device according to the present invention. In FIG. 6, a decoder 46 generates an array select signal AS for selecting an array of the memory on the basis of a row address RA decided by the chip enable signal CE. A spare address generating circuit 47 generates a spare address SA and a spare address use signal SU on the basis of the array select signal AS outputted by the decoder 46. A latch section 48 latches the signals SU and SA outputted by the spare address generating circuit 47. A comparing circuit 49 compares the output preparation signal OP of the synchronizing counter 7 with the spare address of the latch circuit 48. A spare/normal discrimination signal generating circuit 50 generates a spare/normal discrimination signal SNJ indicative of whether the spare address SA or the normal address is used, in response to the comparison result of the comparing circuit 49 and the spare address use signal SU of the latch section 48.

The operation of the circuit as configured as described above will be described hereinbelow.

The row address RA can be decided by the chip enable signal CE. By decoding the decided row address RA by the decoder 46, an array to be selected can be decided. The decided array is represented by the array select signal AS outputted by the decoder 46. This array select signal AS is generated when the chip enable signal CE changes to the level "H" to decide the row address RA. The spare address generating circuit 47 generates the spare address SA and the spare address use signal SU for the cell array to be selected by this signal SA. Here, the spare address SA indicates a defective address of the array, and can be generated as a signal when the fuses are cut off, for instance. On the other hand, the spare address use signal SU is used to discriminate whether a defective address can be replaced with the spare address SA, when the generated spare address SA matches the output preparation signal OP of the synchronizing counter 7. This use signal SU is used to prevent the defective address from being unnecessarily replaced with the spare address SA, as when the output preparation signal OP of the synchronizing counter 7 matches this address accidentally. This is because some address is outputted by the spare address generating circuit 47, even when it is unnecessary to replace the defective address with the spare address. Therefore, the defective address can be replaced with the spare address SA, only when the spare address use signal SU indicates that the spare address SA must be used and simultaneously the output preparation signal OP of the synchronizing counter 7 matches the spare address SA. Accordingly, it is possible to prevent an undesirable replacement as when some defective spare columns exist and therefore must not be replaced with the defective cells as the spare address SA.

The latch section 48 latches the spare address SA and the spare address use signal SU generated by the spare address generating circuit 47 for a necessary time. The comparing circuit 49 compares the spare address SA latched by the latch section 48 with the output preparation signal OP outputted by the synchronizing counter 7. The compared results are outputted to the spare/normal discrimination signal generating circuit 50. Further, in the first cycle immediately after the an address has been read from the column address buffer 6 to the synchronizing counter 7, a column address is given from the column address buffer 6 to the node of the synchronizing counter 7 from which the output preparation signal OP is outputted, under the condition that the column address deciding reference signal RWL is at the level "H". Accordingly, it is possible to discriminate the spare column address or the normal column address previously. In and after the second cycle when the synchronizing counter 7 starts to operate, it is possible to obtain the output preparation signal OP indicative of the succeeding address previously with the use of the signals at the node N6 or the node N7 both shown in FIG. 3. Further, the comparing circuit 49 compares the output preparation signal OP of the synchronizing counter 7 with the spare address SA of the latch section 48. By the operation above, it is possible to determine whether the normal address of the synchronizing counter 7 must be used or the spare address to be replaced therewith must be used.

As the results of the comparison by the comparing circuit 49, only when the spare address SA matches the output preparation signal OP and further the spare address use signal indicates the use of the spare address, the spare/normal discrimination signal generating circuit 50 outputs a signal indicative of the use of the spare address at a required timing, as the spare/normal discrimination signal SNJ. In contrast with this, when the spare address signal SA does not match with the output preparation signal OP, the spare/normal discrimination signal generating circuit 50 outputs a signal indicative of the use of the normal address signal, as the spare/normal discrimination signal SNJ.

Here, when the spare/normal discrimination signal SNJ indicates the use of the normal address, the normal selector 4 outputs the normal column select signal NCSL in response to the counter output signal CO of the synchronizing counter 7, and the spare selector 3 will not output the spare column select signal SCSL. On the other hand, when the spare/normal discrimination signal SNJ indicates the spare address, the normal selector 4 will not output the normal column select signal NCSL, and the spare selector 3 outputs the spare column select signal SCSL.

Figure 7:
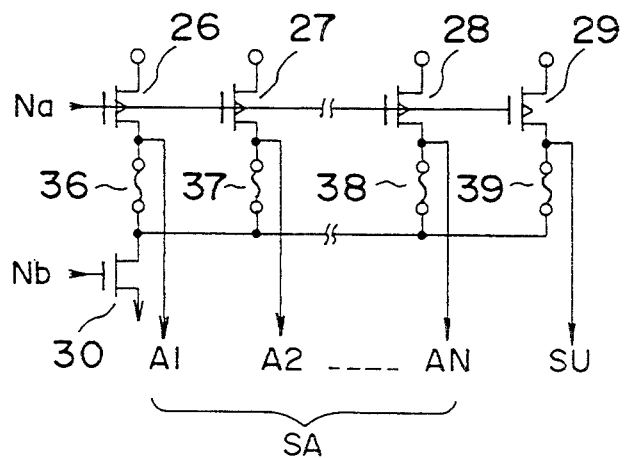
FIG. 7 is a circuit diagram showing an example of the configuration of the spare address generating circuit of the memory device shown in FIG. 6.

FIG. 7 shows the practical circuit configuration of the spare address generating circuit 47 shown in FIG. 6. In FIG. 7, a node Na is connected to the gates of the P-type MOS transistors 26 to 29 for charging, and a node Nb is connected to the gate of the N-type MOS transistor 30 for discharging. The drains of the P-type MOS transistors 26 to 29 are connected to fuses 36 to 39, respectively. The other ends of the fuses 36 to 39 are connected to the drain of the N-type MOS transistor 30, respectively. Further, the spare address SA (A1, A2, . . ., AN) can be derived from the drains of the P-MOS transistors 26 to 28, and the spare address use signal SU can be derived from the drain of the P-type MOS transistor 29.

Figure 8:
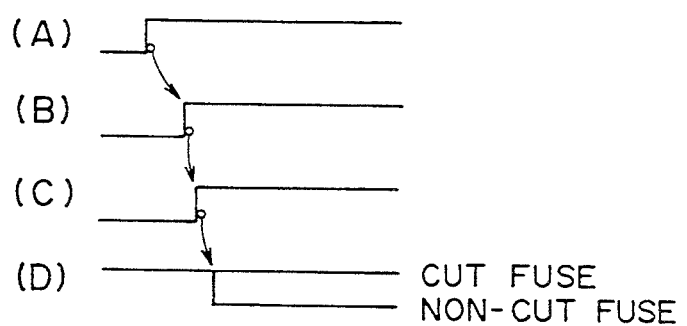
FIG. 8 is a timing chart for assistance in explaining the operation of the memory device shown in FIG. 7.

The operation of the circuit as shown in FIG. 7 will be described hereinbelow with reference to FIG. 8. In FIG. 8, (A) denotes an array select signal AS; (B) denotes the status at the node Na; (C) denotes the status at the node Nb; and (D) denotes the output status of the spare address SA and the spare address use signal SU, respectively.

At first, both the nodes Na and Nb are at the level "L", so that both the nodes of the spare address SA and the spare address use signal SU are charged to the level "H". When the array select signal AS is inputted, the node Na is set to the level "H", which is connected to the gates of the P-type MOS transistors 26 to 29 whose drains are connected to the fuses 36 to 39 corresponding to the selected array. Thereafter, the node Nb is set to the level "H", which is connected to the gate of the N-type MOS transistor 30. As a result, the drains of the P-type MOS transistors 26 to 29 connected to the cut-off fuses 36 to 39 are not discharged, but the drains of the P-type MOS transistors 26 to 29 connected to the non-cut-off fuses 36 to 39 are discharged. Accordingly, the spare address SA and the spare address use signal SU are outputted in accordance with the combinations according to the cut-off status of the fuses 36 to 39. In this connection, when the timing at which the node Na is set to the level "H" is offset from the timing at which the node Nb is set to the level "H", it is possible to prevent a through current from being generated.

In this connection, in the circuit configuration as shown in FIG. 4, when the P-type MOS transistor 15 having the gate at the node N13 is precharged, a through current always flows when the bits of the spare address are not inputted to the nodes N8 to N12. In contrast with this, in the circuit configuration as shown in FIG. 7, there exists such an advantage that the through current can be prevented from flowing therethrough. Further, in FIG. 4, 2N fuses are required for the N address lines connected to the spare decoder 2. In contrast with this, in the case of the circuit configuration shown in FIG. 7, (N+1) fuses are required, therefore (N−1) fuses can be economized. Since a large chip area is occupied by the fuses to be mounted on the memory chip, there exist such advantages that the chip area can be reduced and further manufacturing cost can be also reduced. On the other hand, when the number of fuses to be used is increased, it is possible to improve the ratio of relieving the defective cells and thereby to improve the production yield of the semiconductor memory device. Further, in the serial access, the fuses are used for each cycle and through currents are passed to discriminate the spare and normal address in the case of the circuit as shown in FIG. 4. In contrast with this, in the case of the circuit as shown in FIG. 7, since only a single fuse is used for the one row address and further no through current flows, it is possible to reduce the current consumption markedly.

Figure 22:
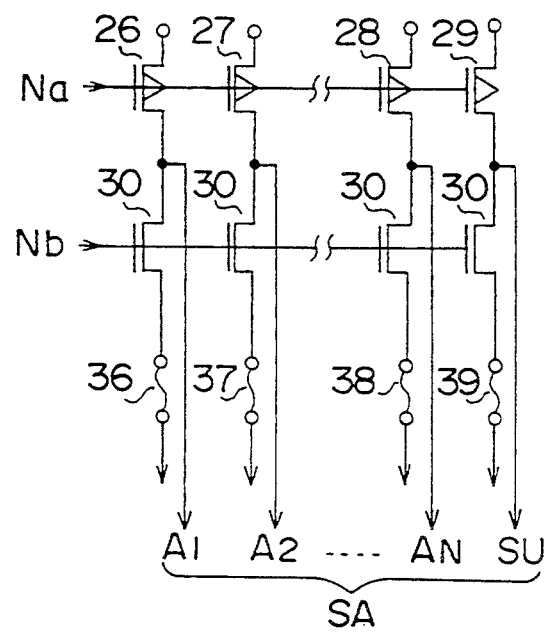
FIG. 22 is a circuit diagram showing another example of the configuration of the spare address generating circuit of the memory device shown in FIG. 6.

Further, in FIG. 7, only one transistor 30 is used in common for the respective bits. However, it is also possible to provide the transistor 30 for each bit. In this case, as shown in FIG. 22, it is possible to dispose the fuses 36 to 39 between the sources of the transistors 30 for the respective bits and a low supply voltage, respectively. In the above configuration, the same function as with the case of FIG. 7 can be obtained.

Figure 9:
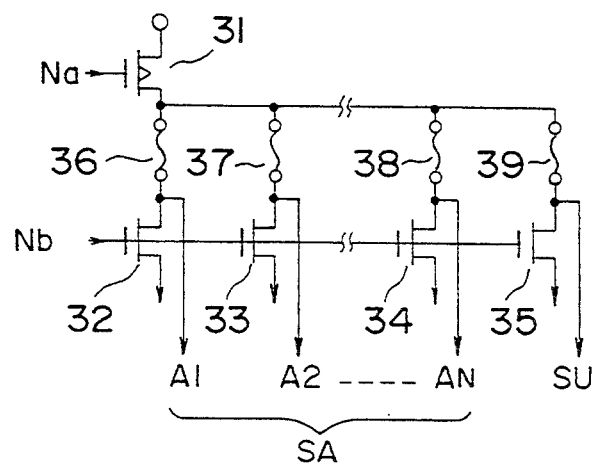
FIG. 9 is a block diagram showing another example of the configuration of the spare address generating circuit of the memory device shown in FIG. 6.

FIG. 9 is a circuit diagram showing still another example of the spare address generating circuit shown in FIG. 6. In FIG. 9, the node Na is connected to the gate of a P-type MOS transistor 31, and the node Nb is connected to the gates of the N-type MOS transistors 32 to 35, respectively. The fuse 36 to 39 are connected to the drain of the P-type MOS transistor 31 and the drains of the N-type MOS transistors 32 to 39, respectively. Further, the spare address SA can be outputted from the drains of the N-type MOS transistors 32 to 34, and the spare address use signal SU can be outputted from the drain of the N-type MOS transistor 35.

Figure 10:
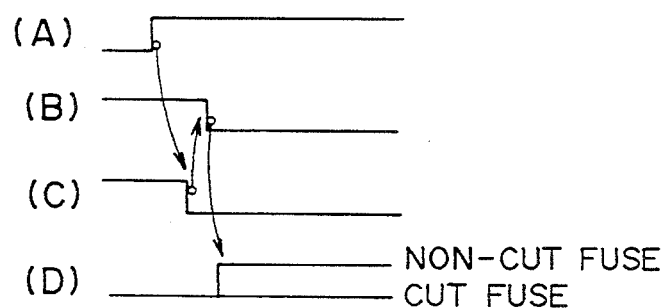
FIG. 10 is a timing chart for assistance in explaining the operation of the memory device shown in FIG. 9.

The operation of the circuit shown in FIG. 9 will be described hereinbelow with reference to a timing chart shown in FIG. 10. In FIG. 10, (A) denotes the array select signal AS; (B) denotes the status at the node Na; (C) denotes the status at the node Nb; and (D) denotes the output status of the spare address SA and the spare address use signal SU, respectively. At first, both the nodes Na and Nb are at the level "H", and the nodes of the spare address SA and the spare address use signal SU are discharged to the level "L", respectively. When the array select signal AS is inputted, the node Nb is set to the level "L", which is connected to the gates of the N-type MOS transistors 32 to 35 whose drains are connected to the fuses 36 to 39 corresponding to the selected array. Thereafter, the node Na is set to the level "H", which is connected to the gate of the P-type MOS transistor 31. As a result, the drains of the N-type MOS transistors 32 to 35 connected to the cut-off fuses 36 to 39 are not charged, but the drains of the N-type MOS transistors 32 to 35 connected to the non-cut-off fuses 36 to 39 are charged. Accordingly, the spare address SA and the spare address use signal SU are outputted in accordance with the combinations according to the cut-off status of the fuses 36 to 39. In this connection, when the timing at which the node Nb is set to the level "L" is offset from the timing at which the node Na is set to the level "L", it is possible to prevent a through current from being generated. Further, in the case of the circuit shown in FIG. 9, it is necessary to prepare fuse cutting-off signals opposite in level to the signals used for the circuit shown in FIG. 7.

Figure 23:
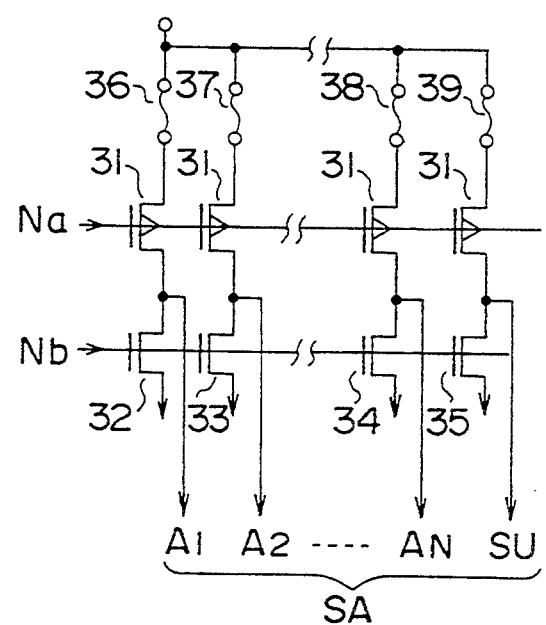
FIG. 23 is a block diagram showing still another example of the configuration of the spare address generating circuit of the memory device shown in FIG. 6.

Further, in FIG. 9, only one transistor 31 is used in common for the respective bits. However, it is also possible to provide the transistor 31 for each bit. In this case, as shown in FIG. 23, it is possible to dispose the fuses 36 to 39 between the sources of the transistors 31 for the respective bits and a high supply voltage, respectively. In the above configuration, the same function as with the case of FIG. 7 can be obtained.

As understood with reference to FIGS. 7 and 9, the fuse cut-off nodes of the spare address SA and the spare address use signal SU are floated. To avoid the signal uncertainty due to floating status, the spare address SA and the spare address use signal SU obtained by the signals applied to the nodes Na and Nb are latched by the latch section 48. The spare address SA latched by the latch section 48 is inputted to the comparing circuit 49, and the spare address use signal SU is inputted to the spare/normal discrimination signal generating circuit 50.

Figure 12:
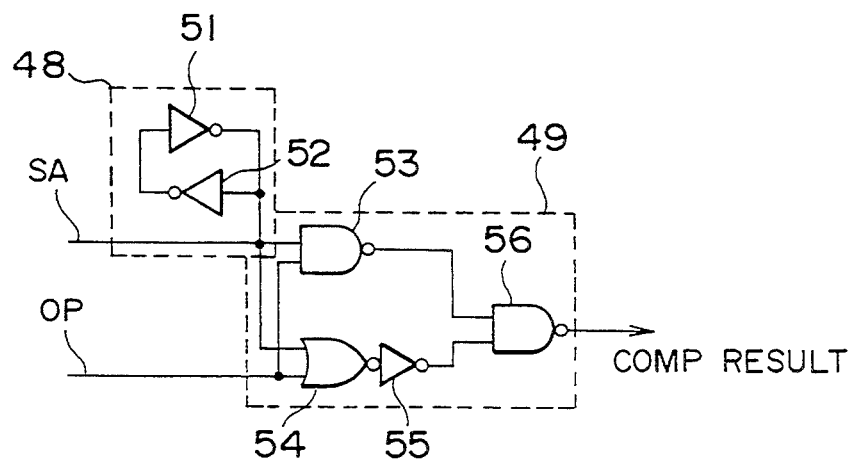
FIG. 12 is a block diagram showing an example of the configuration of the latch circuit 48 and the comparing circuit 49 of the memory device shown in FIG. 6.

FIG. 12 is a block diagram showing a more detailed configuration of the latch section 48 and the comparing circuit 49. In FIG. 12, a clocked inverter circuit 51 and an inverter circuit 52 realize a function for holding the spare address SA. The spare address SA latched by the latch section 48 and the respective bits of the output preparation signal OP outputted by the synchronizing counter 7 are both inputted to a NAND gate 53 and a NOR gate 54, respectively. The output of the NOR gate 54 is inverted by an inverter circuit 55 and then inputted to a NAND gate 56, and the output of the NAND gate 53 is directly inputted to the NAND gate 56.

In the circuit as described above, the NAND gate 53, the NOR gate 54, the inverter circuit 55, and the NAND gate 56 construct an exclusive logical sum circuit, so that when the spare address SA matches the output preparation signal OP in level, a match signal of the level "H" is outputted from the NAND gate 56.

Figure 13:
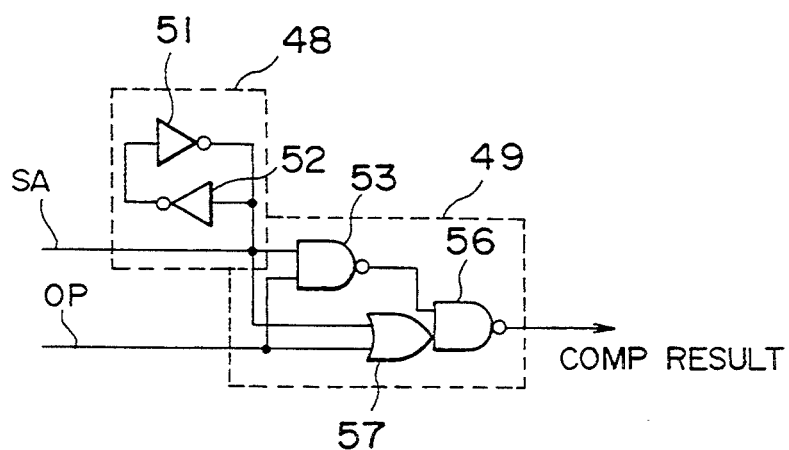
FIG. 13 is a block diagram showing another example of the configuration of the latch circuit 48 and the comparing circuit 49 of the memory device shown in FIG. 6.

FIG. 13 is a block diagram showing another more detailed circuit configuration of the latch section 48 and the comparing circuit 49. In FIG. 13, the series circuit of the NOR gate 54 and the inverter circuit 55 both shown in FIG. 12 is replaced with an OR gate 57. The function of this circuit shown in FIG. 13 is quite the same as that shown in FIG. 12.

Figure 14:
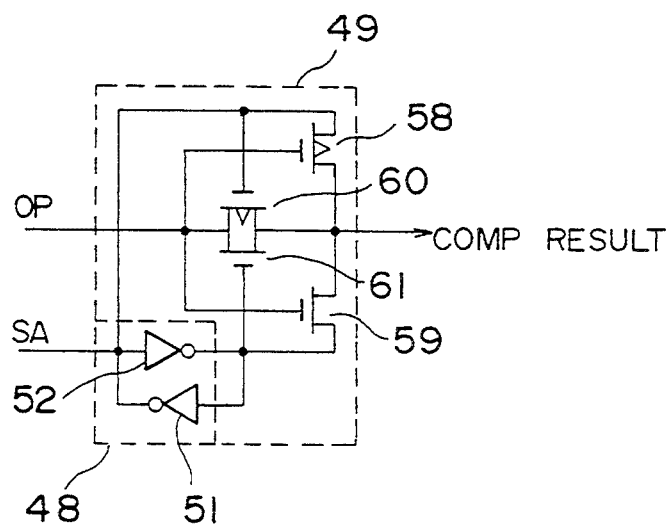
FIG. 14 is a block diagram showing still another example of the configuration of the latch circuit 48 and the comparing circuit 49 of the memory device shown in FIG. 6.

FIG. 14 is a block diagram showing a still another detailed circuit configuration of the latch section 48 and the comparing circuit 49. As shown, the bit of the output preparation signal OP is applied to the gates of a P-type MOS transistor 58 and an N-type MOS transistor 59, respectively. On the other hand, the spare address SA is latched by the latch section 48, and then the inverted bit is inputted to the gate of an N-type MOS transistor 61. Further, the spare address SA is latched by the latch section 48 and then the non-inverted bit is inputted to the gate of a P-type MOS transistor 60.

In the circuit configuration as described above, when the level of the spare address SA is at the level "L", the P-type MOS transistor 60 and the N-type MOS transistor 61 are both turned on, so that the output preparation signal OP is outputted as a comparison result as it is. That is, if the output preparation signal OP is at the level "L", an "L" level comparison result is outputted. If the output preparation signal OP is at the level "H", an "H" level comparison result is outputted. Further, when the output preparation signal OP is at the level "H", the N-type MOS transistor 59 is turned on and the P-type MOS transistor 58 is turned off. In this case, the "H" level discrimination result can be outputted via the N-type MOS transistor 59. On the other hand, when the output preparation signal OP is at the level "L", although the N-type MOS transistor 59 is turned off and the P-type MOS transistor 58 is turned on, in this case, the "L" level discrimination result can be outputted via the P-type MOS transistor 58. In contrast, when the spare address SA is at the level "H", the P-type MOS transistor 60 and the N-type MOS transistor 61 are both turned off. Further, when the output preparation signal OP is at the level "H", the N-type MOS transistor 59 is turned on and the P-type MOS transistor 58 is turned off. In this case, the discrimination result of the level "L" is outputted via the N-type MOS transistor 59. Further, when the output preparation signal OP is at the level "L", the N-type MOS transistor 59 is turned off and the P-type MOS transistor 58 is turned on. In this case, the discrimination result of the level "H" is outputted via the P-type MOS transistor 58. That is, when the output preparation signal OP matches the spare address SA, the level "L" is outputted as the comparison result, and when it does not match, the level "H" is outputted as the comparison result.

Figure 15:
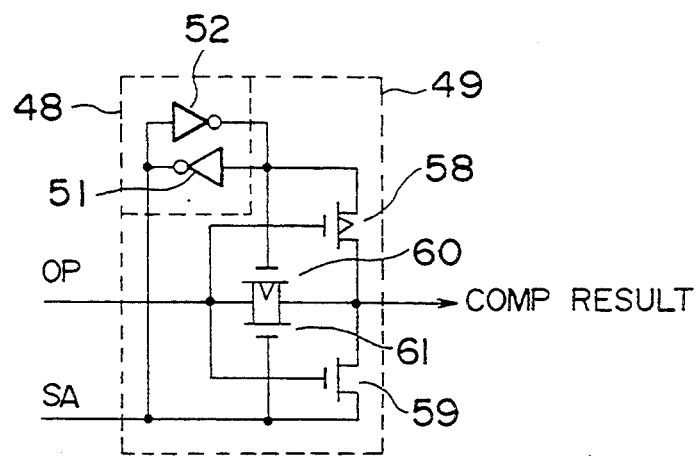
FIG. 15 is a block diagram showing the other example of the configuration of the latch circuit 48 and the comparing circuit 49 of the memory device shown in FIG. 6.

FIG. 15 is a block diagram showing a still another detailed circuit configuration of the latch section 48 and the comparing circuit 49. As shown, the bit of the output preparation signal OP is applied to the gates of a P-type MOS transistor 58 and an N-type MOS transistor 59, respectively. On the other hand, the spare address SA is latched by the latch section 48, and then the inverted bit is inputted to the gate of a P-type MOS transistor 60. Further, the spare address SA is latched by the latch section 48 and then the non-inverted bit is inputted to the gate of an N-type MOS transistor 61.

In the circuit configuration as described above, when the level of the spare address SA is at the level "H", the P-type MOS transistor 60 and the N-type MOS transistor 61 are both turned on, so that the output preparation signal OP is outputted as a comparison result as it is. That is, if the output preparation signal OP is at the level "H", an "H" level comparison result is outputted. If the output preparation signal OP is at the level "L", an "L" level comparison result is outputted. Further, when the output preparation signal OP is at the level "H", although the N-type MOS transistor 59 is turned on and the P-type MOS transistor 58 is turned off, in this case, the "H" level discrimination result can be outputted via the N-type MOS transistor 59. On the other hand, when the output preparation signal OP is at the level "L", the N-type MOS transistor 59 is turned off and the P-type MOS transistor 58 is turned on. In this case, the "L" level discrimination result can be outputted via the P-type MOS transistor 58. In contrast, when the spare address SA is at the level "L", the P-type MOS transistor 60 and the N-type MOS transistor 61 are both turned off. Further, when the output preparation signal OP is at the level "H", the N-type MOS transistor 59 is turned on and the P-type MOS transistor 58 is turned off. In this case, the discrimination result of the level "L" is outputted via the N-type MOS transistor 59. Further, when the output preparation signal OP is at the level "L", the N-type MOS transistor 59 is turned off and the P-type MOS transistor 58 is turned on. In this case, the "H" level discrimination result is outputted via the P-type MOS transistor 58. That is, when the output preparation signal OP matches the spare address SA, the level "H" is outputted as the comparison result, and when does not match, the level "L" is outputted as the comparison result.

Figure 11:
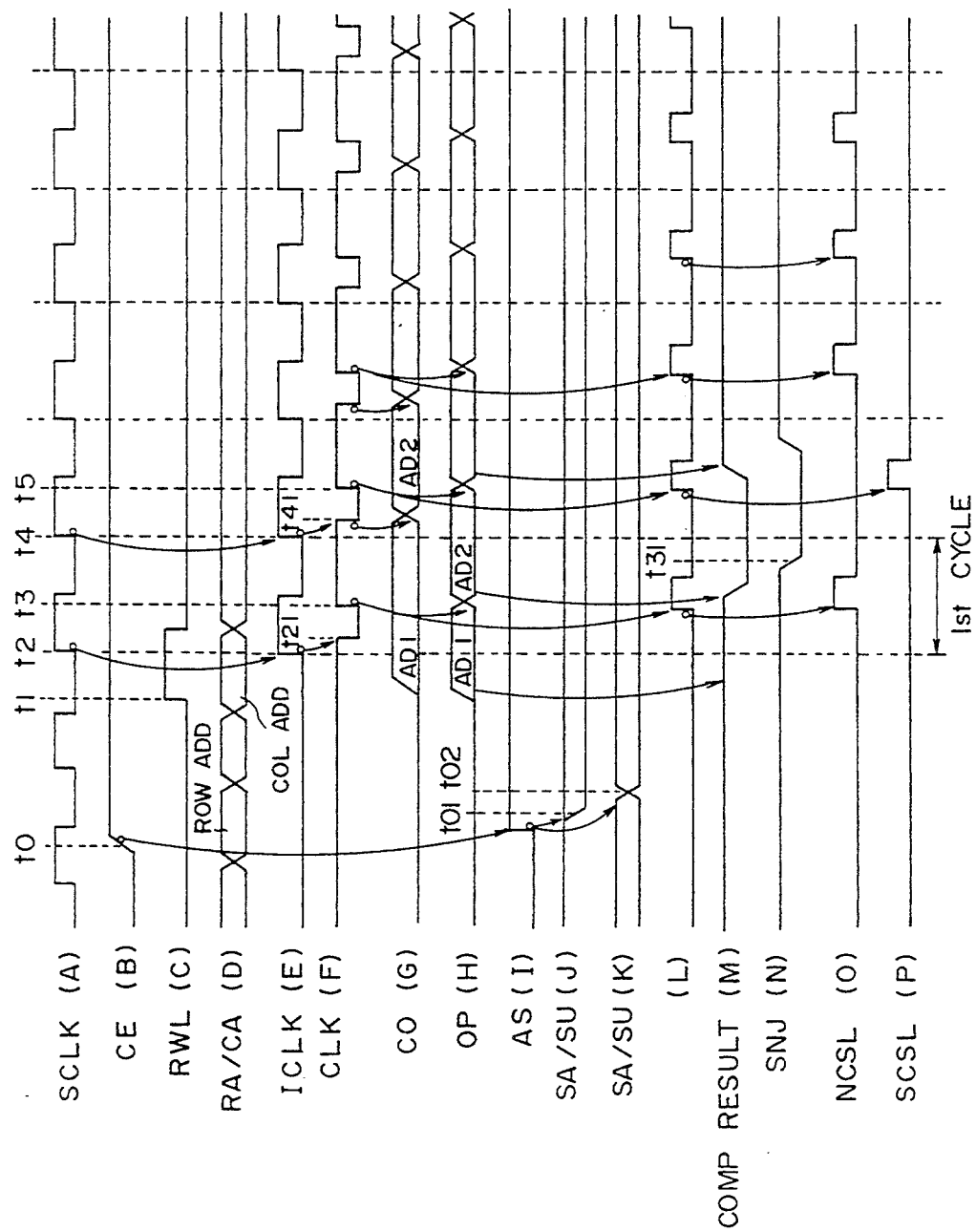
FIG. 11 is a timing chart for assistance in explaining the operation of the memory device shown in FIG. 10.

FIG. 11 is a timing chart showing the above-mentioned operation in sequence. In FIG. 11, (A) denotes a system clock SCLK given externally to determine the operation timing; (B) denotes a chip enable signal CE for selecting this memory chip; (C) denotes an column address deciding reference signal RWL used as a reference of the column address deciding timing; (D) denotes a row address RA and a column address CA given to this memory cell; (E) denotes an internal clock ICLK used as a reference of the operation of the synchronizing counter 7; (F) denotes a clock CLK for driving the synchronizing counter 7 formed on the basis of the internal clock ICLK; (G) denotes a counter output signal CO outputted by the synchronizing counter 7; (H) denotes an output preparation signal OP outputted by the synchronizing counter 7 in advance of the counter output signal CO; (I) denotes an array signal AS given from the decoder 46 to the spare address generating circuit 47; (J) denotes a spare address SA and a spare address use signal SU given from the spare address generating circuit 47 to the latch section 48; (K) denotes a spare address SA and a spare address use signal SU latched by and outputted from the latch section 48; (L) denotes a driving signal for driving the spare selector 3 and the normal selector 4; (M) denotes a comparison result of the comparing circuit 49; (N) denotes a spare/normal discrimination signal SNJ outputted by the spare/normal discrimination signal generating circuit 50; (O) denotes a normal column select signal NCSL outputted by the normal selector 4; and (P) denotes a spare column select signal SCSL outputted by the spare selector 3.

As shown by (B) in FIG. 11, when the chip enable signal CE for selecting the memory tip is inputted at time t0, on the basis of the chip enable signal CE, the array select signal AS is outputted from the decoder 6 to the spare address generating circuit 47 as shown by (I). As a result, the spare address SA and the spare address use signal SU are outputted from the spare address generating circuit 47 at time t01 as shown by (J). Further, these signals are latched by the latch section 48 at time t02 as shown by (K).

Successively, as shown by (C), the column address deciding reference signal RWL used as a reference of the column address deciding timing is given at time t1. That is, the row address is decided when the chip enable signal CE changes from a level "L" to the level "H", and the column address is decided when the column address deciding reference signal RWL changes to the level "H". Then, when the first system clock SCLK rises at time t2, the first one cycle starts. The cycle shifts to the succeeding cycle in sequence whenever the system clock SCLK rises.

On the other hand, after the column address deciding reference signal RWL has changed to the level "H", the internal clock ICLK synchronized with the system clock SCLK is generated. Further, on the basis of time t2 at when the internal clock ICLK rises, the clock CLK for driving the synchronizing counter 7 (which falls at time t21) is formed. Further, at time t1 when the column address deciding reference signal RWL changes to the level "H", a column address is acquired from the column address buffer 6 to the output preparation node of the synchronizing counter 7 on the basis of the column address deciding reference signal RWL. The address AD1 is transmitted to the node N3 and the node N6 both shown in FIG. 3, and outputted from the synchronizing counter 7 as the output preparation signal OP and also as counter output signal CO as shown by (G), immediately thereafter. Therefore, the address of the output preparation signal OP outputted by the synchronizing counter 7 is discriminated by the comparing circuit 49 as to whether the address is the normal address or the spare address. The comparison result obtained as shown by (M) is given to the spare/normal discrimination signal generating circuit 50. Further, as shown by (N), the spare/normal discrimination signal generating circuit 50 outputs the spare/normal discrimination signal SNJ on the basis of the comparison result of the comparing circuit 49 and the spare address use signal SU of the spare address generating circuit 47.

Successively, as shown by (F) in FIG. 11, when the clock CLK changes from the level "L" to the level "H" at time t3, as shown by (L), the spare selector 3 or the normal selector 4 outputs a signal for deciding the spare/normal discrimination signal SNJ. As a result, as shown by (O) and (P), on the basis of the output preparation signal OP, the normal column select signal NCSL changes to the level "H" in the case of the normal address, and the spare column select signal SCSL changes to the level "H" in the case of the spare address.

On the other hand, as shown in by (F), when the clock CLK changes from the level "L" to the level "H" at time t3, the address of the output preparation signal OP of the synchronizing counter 7; that is, the succeeding address AD2 is decided. Therefore, the address AD2 of the output preparation signal OP outputted by the synchronizing counter 7 is discriminated by the comparing circuit 49 and the spare/normal discrimination signal generating circuit 50, as to whether the address is the normal address or the spare address, so that the spare/normal discrimination signal SNJ as shown by (N) can be outputted.

Thereafter, when the system clock SCLK rises at time t4, the succeeding cycle begins. Upon rising of the internal clock ICLK, the clock CLK changes from the level "H" to the level "L" at time t41 as shown by (F), so that the counter output signal CO of the synchronizing counter 7 becomes the succeeding address AD2. In advance of time t3, the output preparation signal OP of the synchronizing counter 7 has already outputted the succeeding address AD2. Therefore, the spare/normal discrimination signal generating circuit 50 outputs the spare/normal discrimination signal SNJ at time t31 as shown by (N). Accordingly, the address AD2 can be decided by the counter output signal CO of the synchronizing counter 7 at time t4. At this time, the discrimination of whether the address is the normal address or the spare address has been completed. Therefore, when the clock CLK changes from the level "L" to the level "H" at time t5, the normal column select signal NCSL or the spare column select signal SCSL is outputted as shown by (O) or (P).

Figure 16:
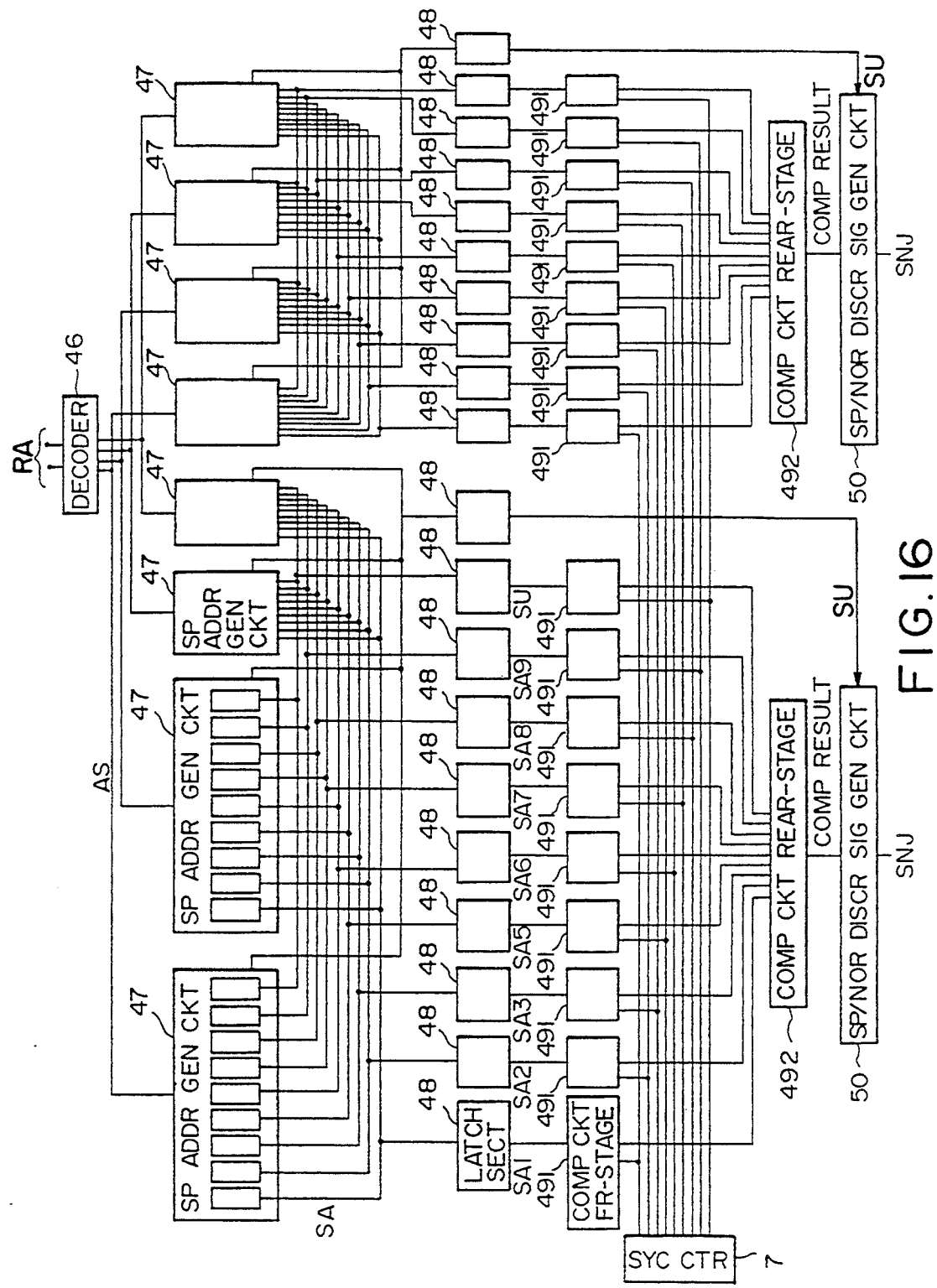
FIG. 16 is a block diagram showing a detailed configuration of the memory device shown in FIG. 6.

FIG. 16 is a block diagram showing a more detailed configuration of the circuit shown in FIG. 6, in which a 4-M bit DRAM is divided into 16 units of cell arrays and the discrimination between the spare address and normal address is effected for a half of the whole chip. As shown in FIG. 16, the comparing circuit 49 shown in FIG. 6 can be realized by both a comparing circuit front-stage section 491 and a comparing circuit rear-stage section 492.

In FIG. 16, two arrays in FIG. 16 or four arrays in the whole chip are selected by two-system row addresses. A single spare address generating circuit 47 is provided for each array to generate the spare addresses SA1 to SA9 and the spare address use signal SU. The comparison result of the comparing circuit front-stage 491 is combined with the comparison result of the comparing circuit rear-stage section 492 which takes into account the spare address use signal SU, and the combined comparison result is outputted to the spare/normal discrimination signal generating circuit 50. As a result, it is possible to obtain the spare/normal discrimination signal SNJ form the spare/normal discrimination signal generating circuit 50. In the case of the circuit configuration shown in FIG. 16, the number of the fuses required for the spare address generating circuit 47 is 160 in total.

Figure 17:
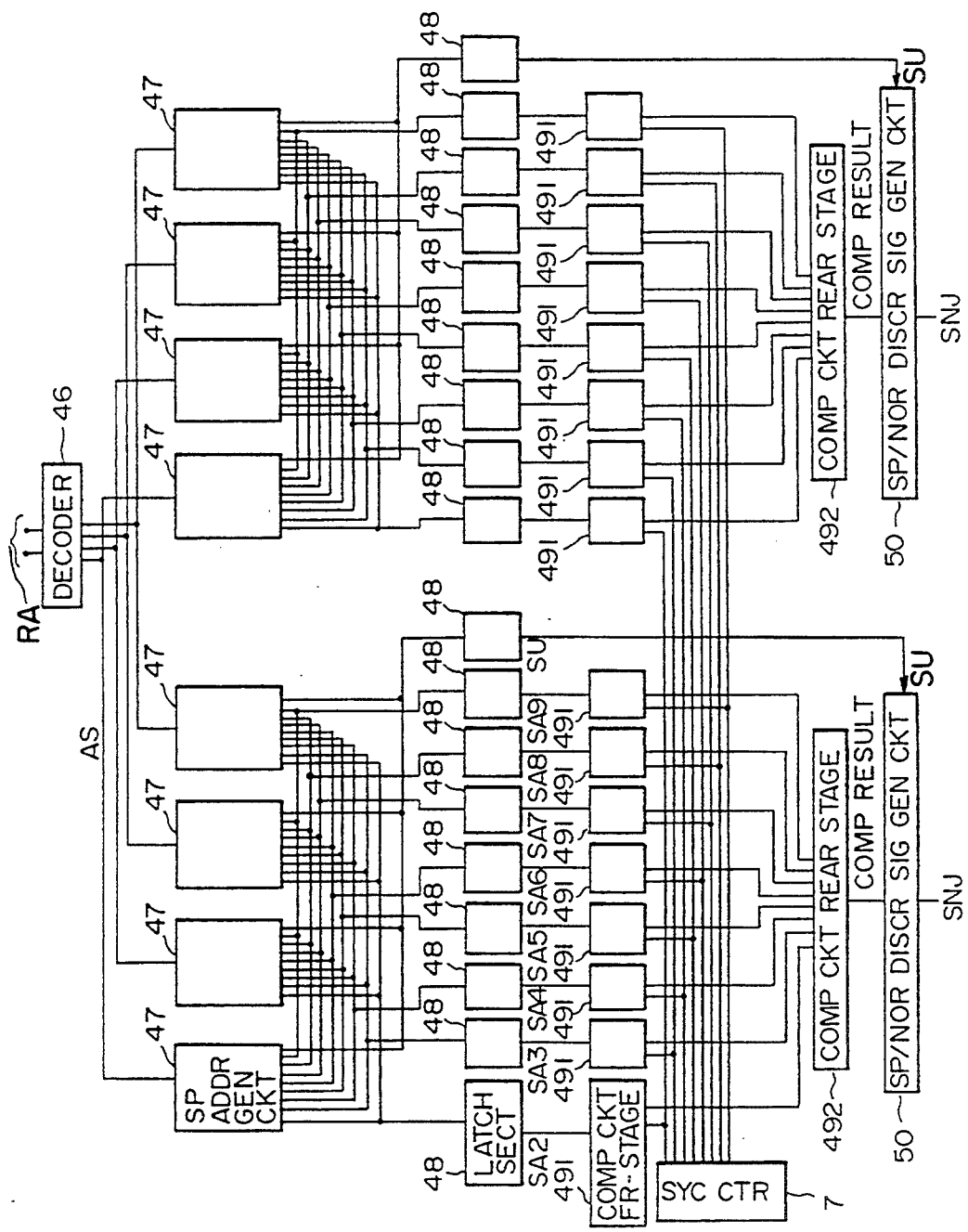
FIG. 17 is a block diagram showing another detailed configuration of the memory device shown in FIG. 6.

FIG. 17 is a block diagram showing another more detailed configuration of the circuit shown in FIG. 6, in which a 4-M bit DRAM is divided into 16 units of cell arrays as with the case shown in FIG. 16 and the discrimination between the spare address and normal address is effected for a half of the whole chip. As shown in FIG. 17, the comparing circuit 49 shown in FIG. 6 can be realized by both a comparing circuit front-stage section 491 and a comparing circuit rear-stage section 492.

In FIG. 17, two arrays in FIG. 17 or four arrays in the whole chip are selected by two-system row addresses. A single spare address generating circuit 47 is provided for each array to generate the spare addresses SA1 to SA9 and the spare address use signal SU. The comparison result of the comparing circuit front stage 491 is combined with the comparison result of the comparing circuit rear-stage section 492 which takes into account the spare address use signal SU, and the combined comparison result is outputted to the spare/normal discrimination signal generating circuit 50. As a result, it is possible to obtain the spare/normal discrimination signal SNJ form the spare/normal discrimination signal generating circuit 50. In the case of the circuit configuration shown in FIG. 17, the number of the fuses required for the spare address generating circuit 47 is 144 in total.

In the circuit configuration shown in FIGS. 16 and 17, the single latch section 48, the single comparing circuit 49, and the single spare/normal discrimination signal generating circuit 50 are used in common for a plurality (four in FIGS. 16 and 17) of the spare address generating circuit 47. Therefore, it is possible to reduce the chip area on the semiconductor chip required for the latch circuits 48, the comparing circuit 49, and the spare/normal discrimination signal generating circuits 50.

Figure 18:
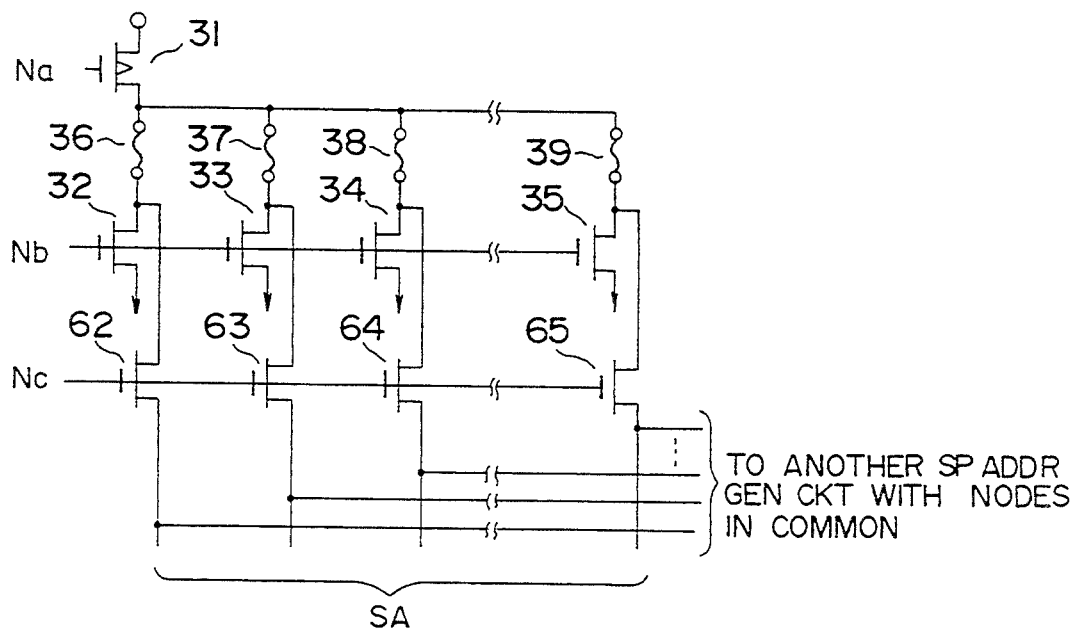
FIG. 18 is a circuit diagram showing another example of the configuration of the spare address generating circuit of the memory device shown in FIG. 6.
Figure 19:
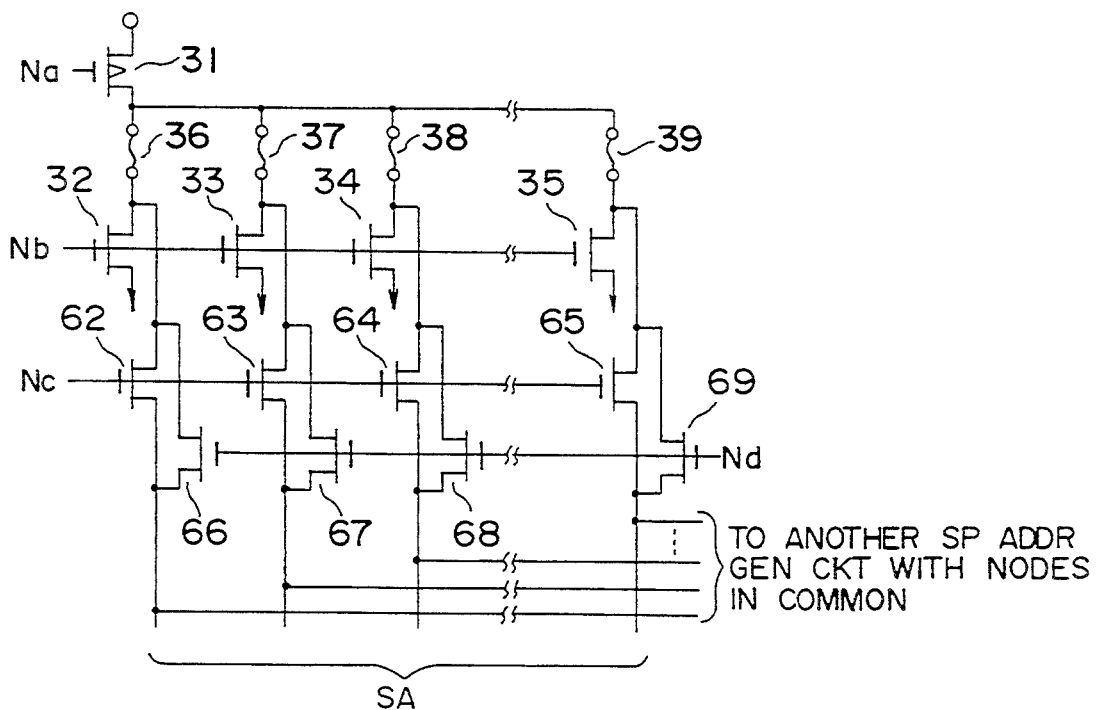
FIG. 19 is a circuit diagram showing another example of the configuration of the spare address generating circuit of the memory device shown in FIG. 6.

FIGS. 18 and 19 are circuit diagrams showing still other examples of the spare address generating circuit 47. In the case of the spare address generating circuit 47 as shown in FIG. 18, N-type MOS transistors 62 to 65 whose gates are connected to the node Nc are provided for each of the nodes for generating the spare address SA. In the case of the spare address generating circuit 47 as shown in FIG. 19, N-type MOS transistors 62 to 65 whose gates are connected to the node Nc are connected in parallel to the N-type MOS transistors 66 to 69 whose gates are connected to the node Nd.

In the circuit configuration as described above, when the single latch section 48, the single comparing circuit 49 and the single spare/normal discrimination signal generating circuit 50 are used in common for a plurality of the spare address generating circuits 47 as shown in FIGS. 16 and 17, it is possible to reduce the capacitance at the nodes by cutting off the nodes of the other spare address generating circuits 47 (which do not transmit the spare address SA, respectively) from the N-type MOS transistors 62 to 65 and the N-type MOS transistors 66 to 69, when the spare address SA is transmitted. Therefore, when the spare address SA and the spare address use signal SU are transmitted from the spare address generating circuit 47, it is possible to reduce the influence by the capacitances at the nodes, thus a high speed operation can be realized.

Figures 20, 21:
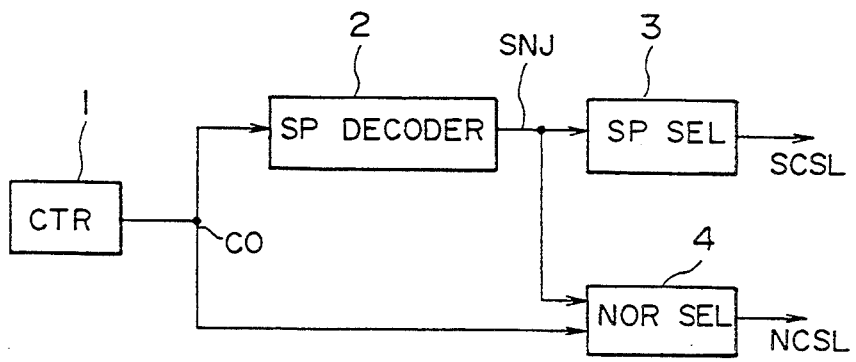
FIG. 20 is a table listing the relationship among the number of the spare/normal discriminating circuits, the number of the spare columns, the relief ratio of defective cells, and the number of fuses used, in comparison between five embodiments of the invention device and the conventional device.
FIG. 21 is a block diagram showing a conventional semiconductor memory device.

FIG. 20 is a table for listing the numerical relationship among the number of the spare/normal discriminating circuits, the number of the spare columns, the relief ratio of defective cells, and the number of fuses to be used, which is obtained when a 4M bit memory is divided into 16 arrays. In the table shown in FIG. 20, five cases including the conventional circuit configuration are Shown. Here, the relief ratio is indicated by taking three cases separately, where the number of defective cells per two arrays is one, two and three, respectively.

As clearly understood in FIG. 20, the number of fuses required to obtain the same defective cell relief ratio as the conventional relief ratio can be reduced markedly from 112 (the conventional number) to 64 (the invention number). On the other hand, when the number of fuses is fixed at 112, it is possible to markedly improve the relief ratio of defective cells.

Further, the method of discriminating the spare address from normal address or vice versa in a cycle before the normal address has been decided can be applied to the write cycle in the fast page mode of the pipeline system. In this case, in a cycle next to the cycle in which the address is acquired, the column address signal corresponding to the address is selected. Therefore, it is possible to discriminate the spare address from the normal address or vice versa in a cycle before the cycle in which the column select signal is selected, by discriminating both on the basis of the address inputted from the column address buffer, so that it is possible to realize a high speed access to the memory device.

As described above, in the semiconductor memory device according to the present invention, since the spare column address for relieving defective cells of the memory device can be decided before the normal column address is decided, it is possible to not only improve the access speed of the memory device but also to reduce the number of fuses and circuit size by using some circuits in common.

What is claimed is:

1. A semiconductor memory device having a normal column address portion and a spare column address portion, a column being selected on the basis of a column select signal obtained from a column address signal, wherein:
   there is provided comparison discriminating means for comparing the column address signal with a spare column address signal corresponding to the spare column address portion to obtain a comparison result and further discriminating whether the column address signal is a normal column address signal or the spare column address signal, on the basis of the comparison result,
   there is provided a synchronizing counter having signal transferring means for receiving an input signal and transmitting an output signal in response to a transfer signal, for outputting the column address signal; and
   said comparison discriminating means includes a comparing circuit for comparing the column address signal prepared at an input node of said signal transferring means as a counter output preparation node of said synchronizing counter, with the spare column address signal.

2. The semiconductor memory device of claim 1, wherein the column address signal is applied through a column address buffer.

3. The semiconductor memory device of claim 1, wherein there is provided a spare address generating circuit for outputting the spare column address signal on the basis of an inputted row address decode signal.

4. The semiconductor memory device of claim 2, wherein there is provided a spare address generating circuit for outputting the spare column address signal on the basis of an inputted row address decode signal.

5. The semiconductor memory device of claim 4, wherein said spare address generating circuit is provided with a plurality of fuses and outputs the spare column address signal according to whether the fuses are cut off or not.

6. The semiconductor memory device of claim 1, wherein said comparing circuit outputs the comparison result of "0" level when the column address signal matches the spare column address signal, and the comparison result of "1" level when the column address signal does not match the spare column address signal.

7. The semiconductor memory device of claim 2, wherein said comparing circuit outputs the comparison result of "0" level when the column address signal matches the spare column address signal, and the comparison result of "1" level when the column address signal does not match the spare column address signal.

8. The semiconductor memory device of claim 3, wherein said comparing circuit outputs the comparison result of "0" level when the column address signal matches the spare column address signal, and the comparison result of "1" level when the column address signal does not match the spare column address signal.

9. The semiconductor memory device of claim 3, wherein the spare column address signal of said spare address generating circuit is applied to said comparison discriminating means after having been latched by a latch section.

10. The semiconductor memory device of claim 4, wherein the spare column address signal of said spare address generating circuit is applied to said comparison discriminating means after having been latched by a latch section.

11. The semiconductor memory device of claim 1, wherein the spare column address signal is inputted to said comparison discriminating means, after a cell array formed by said normal and spare column address portions has been activated.

12. The semiconductor memory device of claim 2, wherein the spare column address signal is inputted to said comparison discriminating means, after a cell array formed by said normal and spare column address portions has been activated.

13. The semiconductor memory device of claim 9, wherein at least one of said latch section and said comparison discriminating means is used together with said spare address generating circuits.

14. The semiconductor memory device of claim 10, wherein at least one of said latch section and said comparison discriminating means is used together with said spare address generating circuit.

15. The semiconductor memory device of claim 3, wherein said spare address generating circuit is provided with a series-connected unit of a charging transistor, a fuse and a discharging transistor which is connected between a high supply voltage and a low supply voltage, for each of bits of the spare column address signal; a junction point between the charging transistor and the fuse is a spare column address signal generating node for one bit; and the spare column address signal for each bit is outputted by discharging or not-discharging the spare column address signal generating node according to whether the fuse is cut off or not, after the spare column address signal generating node has been charged through the charging transistor.

16. The semiconductor memory device of claim 4, wherein said spare address generating circuit is provided with a series-connected unit of a charging transistor, a fuse and a discharging transistor which is connected between a high supply voltage and a low supply voltage, for each of bits of the spare column address signal; a junction point between the charging transistor and the fuse is a spare column address signal generating node for one bit; and the spare column address signal for each bit is outputted by discharging or not-discharging the spare column address signal generating node according to whether the fuse is cut off or not, after the spare column address signal generating node has been charged through the charging transistor.

17. The semiconductor memory device of claim 3, wherein said spare address generating circuit is provided with a series-connected unit of a charging transistor, a fuse and a discharging transistor which is connected between a high supply voltage and a low supply voltage, for each of bits of the spare column address signal; a junction point between the discharging transistor and the fuse is a spare column address signal generating node for one bit; and the spare column address signal for each bit is outputted by charging or not-charging the spare column address signal generating node according to whether the fuse is cut off or not, after the spare column address signal generating node has been discharged through the discharging transistor.

18. The semiconductor memory device of claim 4, wherein said spare address generating circuit is provided with a series-connected unit of a charging transistor, a fuse and a discharging transistor which is connected between a high supply voltage and a low supply voltage, for each of bits of the spare column address signal; a junction point between the discharging transistor and the fuse is a spare column address signal generating node for one bit; and the spare column address signal for each bit is outputted by charging or not-charging the spare column address signal generating node according to whether the fuse is cut off or not, after the spare column address signal generating node has been discharged through the discharging transistor.

19. The semiconductor memory device of claim 15, wherein a single discharging transistor is used in common for a plurality of said series-connected units.

20. The semiconductor memory device of claim 17, wherein a single charging transistor is used in common for a plurality of said series-connected units.

21. The semiconductor memory device of claim 3, wherein said spare address generating circuit is provided with a series-connected unit of a charging transistor, a discharging transistor and a fuse which is connected between a high supply voltage and a low supply voltage, for each of bits of the spare column address signal; a junction point between the charging transistor and the discharging transistor is a spare column address signal generating node for one bit; and the spare column address signal for each bit is outputted by discharging or not-discharging the spare column address signal generating node according to whether the fuse is cut off or not, after the spare column address signal generating node has been charged through the charging transistor.

22. The semiconductor memory device of claim 4, wherein said spare address generating circuit is provided with a series-connected unit of a charging transistor, a discharging transistor and a fuse which is connected between a high supply voltage and a low supply voltage, for each of bits of the spare column address signal; a junction point between the charging transistor and the discharging transistor is a spare column address signal generating node for one bit; and the spare column address signal for each bit is outputted by discharging or not-discharging the spare column address signal generating node according to whether the fuse is cut off or not, after the spare column address signal generating node has been charged through the charging transistor.

23. The semiconductor memory device of claim 3, wherein said spare address generating circuit is provided, with series-connected unit of a fuse, a charging transistor, and a discharging transistor which is connected between a high supply voltage and a low supply voltage, for each of bits of the spare column address signal; a junction point between the charging transistor and the discharging transistor is a spare column address signal generating node for one bit; and the spare column address signal for each bit is outputted by charging or not-charging the spare column address signal generating node according to whether the fuse is cut off or not, after the spare column address signal generating node has been discharged through the discharging transistor.

24. The semiconductor memory device of claim 4, wherein said spare address generating circuit is provided with series-connected unit of a fuse, a charging transistor, and a discharging transistor which is connected between a high supply voltage and a low supply voltage, for each of bits of the spare column address signal; a junction point between the charging transistor and the discharging transistor is a spare column address signal generating node for one bit; and the spare column address signal for each bit is outputted by charging or not-charging the spare column address signal generating node according to whether the fuse is cut off or not, after the spare column address signal generating node has been discharged through the discharging transistor.

* * * * *